United States Patent [19]

Shaheen et al.

[11] 4,147,669

[45] Apr. 3, 1979

[54] CONDUCTIVE ADHESIVE FOR PROVIDING ELECTRICAL AND THERMAL CONDUCTIVITY

[75] Inventors: Joseph M. Shaheen, La Habra; Leo J. Quintana, Orange, both of Calif.

[73] Assignee: Rockwell International Corporation, El Segundo, Calif.

[21] Appl. No.: 869,064

[22] Filed: Jan. 12, 1978

Related U.S. Application Data

[63] Continuation-in-part of Ser. No. 781,609, Mar. 28, 1977, abandoned.

[51] Int. Cl.$^2$ .............................................. H01B 1/02
[52] U.S. Cl. .................................... 252/512; 252/514
[58] Field of Search .............. 252/512, 514; 75/134 T; 260/37 M

[56] References Cited

U.S. PATENT DOCUMENTS

| | | | |
|---|---|---|---|
| 3,134,671 | 5/1964 | Prosen | 75/134 T X |
| 3,475,213 | 10/1969 | Stow | 252/512 X |
| 3,554,738 | 1/1971 | Beldham et al. | 75/134 T |
| 4,015,981 | 4/1977 | Rogova et al. | 75/134 T X |

OTHER PUBLICATIONS

Journal of the American Dental Association, vol. 53, Dec. 1956, pp. 677-685, "Some Physical Properties of Ca–Cu–Sn alloys".
Journal of the American Dental Association, vol. 53, Sep., 1956, pp. 315-324, "Alloys of Gallium with Powdered Metals . . .".
*Constitution of Binary Alloys, First Supplement,* Rodney P. Elliott, Ph.D., McGraw-Hill Book Co., (New York), 1965, pp. 119, 458.

*Primary Examiner*—Benjamin R. Padgett
*Assistant Examiner*—E. Suzanne Parr
*Attorney, Agent, or Firm*—H. Fredrick Hamann; G. Donald Weber, Jr.; Gilbert H. Friedman

[57] ABSTRACT

An electrically and thermally conductive adhesive containing a metal alloy dispersed in a resin is disclosed. The composition of the adhesive may include a resin mixture and a gallium-metal alloy. The composition is very stable, is a liquid at room temperature and cures at a relatively low temperature with excellent adhesion and conduction properties and is resistant to relatively high temperatures.

7 Claims, No Drawings

CONDUCTIVE ADHESIVE FOR PROVIDING ELECTRICAL AND THERMAL CONDUCTIVITY

CROSS REFERENCE TO RELATED APPLICATIONS

This application is a continuation-in-part of application Ser. No. 781,609 filed Mar. 28, 1977, and now abandoned, for Conductive Adhesive for providing Electrical and Thermal Conductivity.

BACKGROUND OF THE INVENTION

1. Field of the Invention

This invention relates, generally, to electrically and thermally conductive adhesives and, more particularly, to adhesives containing a mixture of gallium (or gallium eutectic) and other conductive materials dispersed in a resin.

2. Description of the Prior Art

There are many requirements for electrically and thermally conductive adhesives. One of the specific areas having this requirement is the semiconductor industry. This requirement is especially keen in the process of bonding a semiconductor die (or dice) to a support medium. However, a major problem area exists in the die bonding processes presently utilized by the semiconductor industry. The primary source of this problem is associated with the required use of high temperature (in the range of 175° C. or higher) to secure the die to the device while curing the adhesive.

Presently known materials used for this purpose include powdered gold, silver, copper and metal oxides mixed with a resin. These materials generally result in a volume resistivity of approximately 0.05 to 0.001 ohm-cm and a thermal conductivity of 7 to 12 BTU/(hr. - Sq. Ft./°F/in.). However, use of these conductive adhesives requires approximately 175° C. for curing such that the die adheres to the semiconductor device. This temperature range is likely to contribute to or even cause the failure of many such devices.

Another known process is eutectic bonding. However, eutectic bonding generally requires a temperature of approximately 200° C. (or more) for fusing the die to the device. Such a high temperature is undesirable in many processes in that the die is adversely affected by high temperatures.

Pertinent prior art discovered by applicant relative to this invention is listed herewith as well as in the Prior Art Statement filled herewith. The patent to Prosen (U.S. Pat. No. 3,134,671) discloses a metal alloy with low percentages of gallium. The use is directed to dental appliances and articles of jewelry. The gallium is utilized for lowering the melting point of the alloys.

The patent to Saffir (U.S. Pat. No. 3,513,123) also discloses use of small amounts of gallium in dental alloys for the purpose of modifying the color and for the expansion characteristics of the dental alloys during hardening. The patent to Devaney et al. (U.S. Pat. No. 2,947,646) describes a cellulose acetate film containing colloidally dispersed gallium for use in plastic materials.

Reference is also made to the following publications which are incorporated herein by reference. "Detailed Techniques for Preparing and Using Hard Gallium Alloys", Tech. Note 140, U.S. Dept. of Commerce, NBS, PB - 161641, Harman; "Alloys of Gallium with Powdered Metals as Possible Replacement for Dental Amalgram", Smith et al., Journal of American Dental Association (JADA), Vol. 53, Sept. 1956, pp 315-324; and "Some Physical Properties of Gallium - Copper - Tin Alloys", Smith et al., JADA, Vol. 53, Dec. 1956, pp. 677-685.

Thus, there is a need for adhesive materials having high thermal and electrical conductivity and which do not require high temperatures for curing, this improving the yield in th bonding of devices.

SUMMARY OF THE INVENTION

This invention relates to electrically and thermally conductive adhesives containing gallium and other metals dispersed in a resin. The instant invention is a composite which is formed by producing a substantially liquid eutectic of gallium and another metal such as tin, indium or the like. The eutectic is mixed with a powdered metal such as gold, copper, silver, or any other electrically conductive material to form an alloy which is then dispersed in a resin such as, for example, an epoxy with a curing agent, or the like. The composite is typically produced in the form of a paste which cures to a relatively homogeneous solid mass to form a conductive bond between two items.

An alternate embodiment of the instant invention utilizes other low temperature hardening resin formulations such as, for example, those employing silicone rubber, one of the low-temperature hardening polyesters, or the like. Also, other gallium alloys or mercury amalgams can be substituted to modify the electrical and thermal conduction properties of the adhesive.

DESCRIPTION OF THE PREFERRED EMBODIMENT

In a preferred embodiment, gallium (89%) and tin (11%) are first mixed together to form a eutectic mixture. Typically, the gallium is heated to 30° C. and is in the liquid state while the tin is in powder form. The gallium is found to be desirable because it has the ability to be mixed and to form a eutectic mixture which remains liquid at room temperature. Generally, the eutectic does not require heat to react with other metals. Moreover, the eutectic remains in the liquid form at room temperature.

A powdered metal such as gold, silver, copper or the like is then mixed with the eutectic mixture to form an alloy. The alloy is, generally, formed of a 50/50 weight proportion of the eutectic and the powdered metal. However, the proportions may vary from 20/80 to 80/20 of the same materials. The alloy is, initially, a paste-like mixture. The wetness of the paste is a function of the materials used and the proportions thereof.

Next, a resin or resin with curing agent is mixed with the alloy; the resin and the alloy harden independently of one another but form a relatively homogeneous mass capable of forming a relatively homogeneous junction between a die and a carrier to which it is bonded. The resinous portion of the composition used in this invention can comprise a mixture of one or more known epoxy resins. The desired characteristics of the epoxy resin include the requisite adhesiveness between the composition and the substrate surface. The epoxy resins utilized in this invention are sold by such companies as Shell. The curing agents, if any, utilized in this invention are generally derived from the respective company that produces the eposy resins. The amount of curing agent that is used in conjunction with the epoxy resins in the gallium alloy composition of the present invention is based on the weight of the resin. The amounts of epoxy resin in the composition can vary up to 25% by weight. However, smaller amounts of epoxy resin (on the order of 1-10%) are preferred. The preferred resin content is on the order of 2% to 6% by weight. Hence lesser amounts of the curing agent are also desirable from a higher conductivity standpoint.

The typical formulation and procedure for forming the preferred composition is as follows:

| Eutectic - | Gallium | 89% |
| --- | --- | --- |
| | Powdered Tin | 11% |
| Alloy - | Eutectic | 40% |
| | Powdered Gold | 60% |
| Composition - | Alloy | 75% |
| | Resin | 25% |

Of course, it should be understood that in forming the eutectic, the gallium may be mixed with indium or other powdered metals in the same family, viz., boron, aluminum, and tellurium. This is a function of the metal available and the mixing temperatures desired in forming the eutectic.

The euthetic may be mixed with powdered metals other than gold. For example, silver, copper and many other conductive metals or alloys can be utilized. Also, the optimum percentages will vary as a function of materials used.

The resin to be used can be of any suitable type such as versamid (General Mills) 125, Epon 815 (Shell), Delta ER11-201A (Delta Plastics) or the like. While a range of resin in the composition of up to 25% (by weight) is suggested, better results are achieved at 10% or less. That is, greater electrical conductivity is achieved with satisfactory adhesion.

Specific adhesive formulations, all of which were separately cured at room temperatures and at 125° C., have been made and tested and are listed as follows:

Example 1

| | Percent by Weight |
| --- | --- |
| Gallium Eutectic | 49 |
| Gold Powder | 48 |
| Delta Epoxy Resin (ER11-201A) | 2.99 |
| Delta Epoxy Curing Agent (ER11-201B) | .01 |

This adhesive possesses excellent adhesion to silicon, alumina, gold plated alumina, gold plated Kovar and rolled annealed copper. The electrical resistivity measurements remained relatively constant (about $55 \times 10^{-6}$ ohm-cm) through a wide range of temperatures and for a prolonged period at high temperatures (e.g. 60 hours at 350° F.) The thermal conductivity of this formulation, which was found to be brittle, is comparable to metal filled epoxies (i.e. $0.015 \pm 0.002$ watts/inch° C.). The coefficient of expansion was well within the expansion requirements of conductive adhesives used in hybrid packaging ($6.5 \times 10^{-5}$ below $T_G$; $3 \times 10^{-4}$ above $T_G$ when $T_G$ is below 15° C.). A thermal gravimetric analysis performed on this formulation revealed a weight loss well under the requirements of hybrid packaging (0.3% weight loss at 250° C.).

Example 2

| | Percent by Weight |
| --- | --- |
| Gallium Eutectic | 47 |
| Gold Powder | 47 |
| Delta Epoxy Resin (ER11-201A) | 5.98 |
| Delta Epoxy Curing Agent (ER11-201B) | .02 |

This formulation was found to have essentially the same properties as the formulation in Example 1 with the exception that this formulation exhibited a somewhat higher electrical resistivity, i.e. $100 \times 10^{-6}$ ohm-cm after 60 hours at 350° F. This increase is attributed to the higher percentage of epoxy resin.

Example 3

| | Percent by Weight |
| --- | --- |
| Gallium Eutectic | 49 |
| Silver Powder | 48 |
| Delta Epoxy Resin (ER11-201A) | 2.99 |
| Delta Epoxy Curing Agent (ER11-201B) | .01 |

This formulation exhibited similar results as Examples 1 and 2 with an intermediate electrical resistivity (i.e. $87 \times 10^{-6}$ ohm-cm after 60 hours at 350° F.).

Example 4

| | Percent by Weight |
| --- | --- |
| Gallium Eutectic | 47 |
| Silver Powder | 47 |
| Delta Epoxy Resin (ER11-201A) | 5.98 |
| Delta Epoxy Curing Agent (ER 11-201B) | .02 |

This formulation had substantially the same characteristics as found in Examples 2 and 3 except that the resistivity was about $120 \times 10^{-6}$ ohm-cm after 60 hours at 350° F.

It should also be understood that the instant invention is not limited to gallium-metal alloys alone. Other gallium alloys or mercury amalgams, for example, can be substituted to modify the properties of these conductive adhesives. Reference is made to the papers noted above for detailed analyses of some of the properties of the materials in question. The teachings of the referenced papers are included herein by reference.

Thus, there are shown preferred formulations including a liquid eutectic mixed with metal to form an alloy which is mixed with a resin to produce a conductive adhesive. The result is that the instant invention provides a conductive adhesive which permits die bonding of devices at room temperature thereby decreasing the risk of device failures as well as lowering the costs of fabricating and processing device wafers. In some applications, it may be desirable to cure the adhesive at approximately 125° C. for about two (2) hours to effect a good conductive adhesion. This procedure is, generally, not deleterious to semi-conductor devices. Variations in the formulations and curing may be suggested to those skilled in the art. For example, the percentages, the materials and the like may be altered somewhat. However, these variations are intended to be included in the instant description. This description is intended to be illustrative only and not limitative of the invention. The scope of the invention is intended to be limited only by the claims appended hereto.

Having thus described a preferred embodiment of this invention, what is claimed is:

1. A conductive adhesive comprising:

a quantity of gallium;

a first powdered conductive material in that quantity which forms a substantially eutectic mixture which is in a completely liquid state at about room temperature when combined with said quantity of gallium wherein said first conductive material is selected from the group consisting of tin, indium, and aluminum;

a second powdered conductive material in that quatity which forms a curable alloy initially having the consistency of a paste and having the composition in percent by weight of from 20–80 percent of said eutectic mixture and from 20–80 percent by weight of said second conductive material when said second conductive material is combined with said eutectic mixture wherein said second conductive material is selected from the group consisting of gold, silver, and copper; and a low temperature hardening resin material in that quantity which forms said conductive adhesive when combined with said curable alloy, said conductive adhesive having the composition in percent by weight of from about 75–99 percent of said alloy and from about 1–25 percent of said resin material wherein said resin material is selected from the group consisting of epoxy, silicone rubber, and polyester; and wherein said conductive adhesive hardens to a relatively homogenous mass at relatively low termperatures.

2. The conductive adhesive recited in claim 1 wherein said alloy is comprised of about 40% of said eutectic mixture and about 60% of said second powdered conductive material, and said conductive adhesive is comprised of about 25% or less of said resin material and about 75% or more of said alloy.

3. The conductive adhesive recited in claim 1 wherein said eutectic mixture comprises about 89% gallium and about 11% tin.

4. The conductive adhesive recited in claim 1 wherein said eutectic mixture comprises about 49% of said conductive adhesive, said second powdered conductive material comprises about 48% of said conductive adhesive, and said resin material comprises about 3% of said conductive adhesive.

5. The conductive adhesive recited in claim 1 wherein said eutectic mixture comprises about 47% of said conductive adhesive, said second powdered conductive material comprises about 47% of said conductive adhesive, and said resin material comprises about 6% of said conductive adhesive.

6. The conductive adhesive recited in claim 1 wherein said adhesive is cured to an electrically and thermally conductive mass by heating to 125° C. for about two hours.

7. A method of making a conductive adhesive material comprising the steps of:

mixing a quantity of gallium with that quantity of a powdered metal which forms a substantially eutectic mixture which is in a completely liquid state at about room temperature, wherein said metal is selected from the group consisting of tin, indium, and aluminum;

mixing a quantity of said eutectic mixture with that quantity of an electrically conductive powdered material which forms a curable alloy initially having the consistency of a paste and having the composition in percent by weight of from 20–80 percent of said eutectic mixture and from 20–80 percent of said powdered material wherein said powdered material is selected from the group consisting of gold, silver, and copper; and mixing of said alloy with a low temperature hardening resin material to form a relatively homogeneous conductive adhesive having the composition in percent by weight of from about 75–99 percent of said alloy and from about 1–25 percent of said resin material wherein said conductive adhesive will effectively harden and form an electrically conductive bond at a relatively low temperature and wherein said resin material is selected from the group consisting of epoxy, silcone rubber, and polyester.

* * * * *